US006748289B2

(12) United States Patent
Nishikawa et al.

(10) Patent No.: US 6,748,289 B2
(45) Date of Patent: Jun. 8, 2004

(54) METHOD FOR CONTROLLING SCREEN PRINTER

(75) Inventors: Noboru Nishikawa, Yamanashi (JP); Akihiko Wachi, Yamanashi (JP); Hiroyoshi Saito, Kofu (JP)

(73) Assignee: Matsushita Electric Industrial Co., Ltd. (JP)

( * ) Notice: Subject to any disclaimer, the term of this patent is extended or adjusted under 35 U.S.C. 154(b) by 302 days.

(21) Appl. No.: 09/765,667

(22) Filed: Jan. 22, 2001

(65) Prior Publication Data
US 2002/0019680 A1 Feb. 14, 2002

Related U.S. Application Data

(62) Division of application No. 09/155,817, filed as application No. PCT/JP97/01631 on May 14, 1997, now abandoned.

(30) Foreign Application Priority Data

May 15, 1996  (JP) ............................. 8-120487
May 15, 1996  (JP) ............................. 8-120488
May 15, 1996  (JP) ............................. 8-120489

(51) Int. Cl.⁷ ............................. G06F 19/00; G06K 9/00
(52) U.S. Cl. ..................... 700/121; 29/701; 101/123; 414/277; 425/110
(58) Field of Search ................. 700/121, 123, 700/124, 125; 101/481, 484, 485, 492, 126, 129; 382/145, 147, 151; 414/277; 29/701

(56) References Cited

U.S. PATENT DOCUMENTS 4,362,486 A * 12/1982 Davis et al. ................. 425/110
5,197,384 A    3/1993 Yawata et al.
5,287,806 A *  2/1994 Nanzai ....................... 101/123
5,329,690 A *  7/1994 Tsuji et al. ................... 29/701
5,380,138 A *  1/1995 Kasai et al. ................. 414/277
5,571,910 A   11/1996 Walker et al.
5,740,729 A *  4/1998 Hikita et al. ................. 101/126
5,751,910 A *  5/1998 Bryant et al. .................. 706/2

FOREIGN PATENT DOCUMENTS

DE  39 28 525 A1    3/1991
EP  0 204 901      12/1986
GB  2 279 899       1/1995

OTHER PUBLICATIONS

Shigeru Okada, "Testing Machines Enhance Yield, Throughput in Mobilecom Production", *JEE Journal of Electronic Engineering*, Jun. 30, 1993, No. 318, Tokyo, JP, pp. 85–89.

* cited by examiner

Primary Examiner—Leo Picard
Assistant Examiner—Douglas S. Lee
(74) Attorney, Agent, or Firm—Parkhurst & Wendel, L.L.P.

(57) ABSTRACT

The present invention relates to a control method for improving the productivity of a screen printer for an electronics-mounting machine. Thus, a screen printer according to this invention uses a recognition camera to inspect the results of printing of a circuit board concurrently with a cleaning operation of the rear surface of a screen, thereby enabling the effective use of time. This screen printer also enables cream solder to be automatically supplied to reduce the operation time by determining whether the next screen to be used is unused. During automatic screen replacement, this screen printer enables a desired screen stored in the corresponding stocker to be automatically specified in order to replace the current screen in response to a selected NC program.

3 Claims, 15 Drawing Sheets

FIG.7

HEADER SECTION----------------------------#14
    PROGRAM NAME
    DATE OF CREATION

PROGRAM OFFSET SECTION----------------------#15

NC DATA SECTION----------------------------#16
    SCREEN POSITION (XY COORDINATES)

MARK LAND DATA SECTION----------------------#17
    CIRCUIT BOARD MARK POSITION (XY COORDINATES)
    MARK LIBRARY

SCREEN MARK DATA SECTION--------------------#18
    SCREEN MARK POSITION (XY COORDINATES)
    MARK LIBRARY

CORRECTION DATA SECTION---------------------#19

SCREEN DATA SECTION------------------------#20
    STOCKER NUMBER
    SCREEN SIZE

FIG.15 PRIOR ART

HEADER SECTION ---------------------------------- #14
   PROGRAM NAME
   DATE OF CREATION

PROGRAM OFFSET SECTION ---------------------------- #15

NC DATA SECTION ---------------------------------- #16
   SCREEN POSITION (XY COORDINATES)

MARK LAND DATA SECTION --------------------------- #17
   CIRCUIT BOARD MARK POSITION (XY COORDINATES)
   MARK LIBRARY

SCREEN MARK DATA SECTION ------------------------- #18
   SCREEN MARK POSITION (XY COORDINATES)
   MARK LIBRARY

CORRECTION DATA SECTION -------------------------- #19

METHOD FOR CONTROLLING SCREEN PRINTER

This is a Division of application Ser. No. 09/155,817 filed Oct. 6, 1998 now abandoned, which is a 371 of PCT/JP97/01631 May 14, 1997.

TECHNICAL FIELD

The present invention relates to a control method for improving the productivity of a screen printer for an electronics-mounting machine.

BACKGROUND ART

A screen printer for an electronics-mounting machine prints cream solder on a circuit board of an electronic part. There are several problems to be solved in order to improve the productivity of this printer. A first problem is the correction of locational offset between a printed pattern of a screen and a pattern on the circuit board. A procedure for improving the printing accuracy of a conventional screen printer is described with reference to FIGS. 8 to 11.

FIG. 8 is a perspective view of a screen printer. A circuit board loaded by a loader 1 is fixed to a stage section 2. A recognition camera 3 recognizes a circuit board target mark, and a stage moving section 4 and a stage elevating section 5 position the circuit board in a screen 6. Subsequently, a print head section 7 moves in the lateral direction for printing and the stage elevating section 5 lowers to perform a print separating operation. Then, a cleaner section 8 moves forward and backward to clean the rear surface of the screen, but at this point, the stage moving section 4 on the rear surface of the screen is located so as to contact the cleaner section 8, so the stage moving section must retreat to the loader 1 side together with the circuit board. Once the cleaning operation is finished, the stage moving section 4 moves to an unloader 9 side, where the circuit board is unloaded to the unloader 9.

FIG. 9 is a flowchart describing a process of a conventional general screen printer.

The operation of each step is described based on the flowchart with reference to FIG. 9.

When the program starts at #1 and a circuit board waiting state (upstream side) is exited at #2, a circuit board is loaded by the loader 1 at #3 and fixed to the stage section 2 at #4, and the recognition camera 3 recognizes the circuit board target mark. At #5, the stage moving section 4 and the stage elevating section 5 position the circuit board at a screen target mark that has been already recognized, and at #6, the print head section 7 performs a printing operation. At #7, the stage elevating section 5 retreats the stage, and at #8, the cleaner section 8 cleans the rear surface of the screen. When the circuit board waiting state (downstream side) is exited at #11, the stage moving section 4 moves at #12 to unload the circuit board, thereby finishing the production of the single one circuit board. Furthermore, if production is to be continued, the process returns to #2 from #13 to repeat the same steps. If production is to be finished, the process finishes at #14.

The occurrences of #2 and #11 depend on the production conditions of the mounting machine on the upstream and downstream sides.

FIG. 10 is a flowchart describing a procedure for improving the printing accuracy of a conventional screen printer having no inspection function. Steps #1 to #8, #11, and #12 are the same as in FIG. 9 and their description is omitted.

When a circuit board is unloaded at #12, the machine is stopped at #15, and an operator uses a microscope to measure the results of printing at #16 and registers the locational difference between a screen pattern and a circuit board pattern, in the machine as an offset to reflect the measured offset in the subsequent printing correction operation at #17. At #18, the operator re-operates the machine, and the subsequent steps are the same as in FIG. 9.

FIG. 11 is a flowchart describing a procedure for improving the printing accuracy of a conventional screen printer having a function for inspecting the results of printing. Steps #1 to #8 are the same as in FIG. 9. When the cleaning operation is finished at #8, the machine inspects the results of printing at #9 and registers the locational difference between the screen pattern and the circuit board pattern at #10 to reflect it in the subsequent printing correction operation. The subsequent steps are the same as in FIG. 9.

In the process executed by the conventional screen printer having no inspection function, the machine must be halted to measure the offset between the screen pattern and the circuit board pattern, and a step is required in which the operator inspects the results of printing, thereby reducing productivity.

In addition, in the conventional screen printer having a function for inspecting the results of printing, a step for inspecting the results of printing is required that follows the cleaning operation. The inspection of the results of printing requires a large amount of time, thereby reducing the productivity of the printer.

A second problem relates to an automatic solder supply method executed by the conventional screen printer.

FIG. 12 is a perspective view of a screen printer. A used screen is collected from the inside of a printer body 10 by a stocker section 12 in an automatic screen replacing apparatus 11. In addition, a plurality of unused screens are stored beforehand in the stocker section 12 in the automatic screen replacing apparatus 11 so that a screen corresponding to a produced circuit-board type is loaded in the printer body 10 from the automatic screen replacing apparatus 11 to switch the circuit-board type. Cream solder must be filled on an unused screen by an automatic solder supply apparatus 13. In addition, cream solder remains filled on a used screen that has been used for production once and that has been stored in the stocker section 12 unless the screen is cleaned of the solder.

FIG. 13 is a flowchart describing an automatic solder supply method carried out after automatic screen replacement in a screen printer having the automatic screen replacing apparatus 11 and the automatic solder supply apparatus 13. At #1, the program starts, and at #2, the production of a circuit board starts. If it is determined at #3 that the production of a different circuit board is to be continued, the screen is replaced at #4. At #8, the machine is halted, and at #9, the operator determines whether cream solder must be supplied to the screen for use. If the screen for use is unused and solder must be supplied, the operator issues a command to the automatic solder supply apparatus 13 at #10, and an automatic solder supply operation is performed at #6. If the screen is a used one, cream solder remains on the screen so the automatic solder supply operation is not performed. At #11, the operator issues a production restart command, and the process returns to #2 to resume production. In addition, if it is determined at #3 that production is not to be continued, it is finished at #7.

In the screen printing method of the conventional electronics-mounting machine, the operator must determine whether solder must be supplied to a screen for use after automatic screen replacement, resulting in an unwanted increase in the number of required steps. Thus, the machine must be halted and re-operated regardless of the presence of the solder supply operation, thereby reducing the productivity of the printer.

A third problem relates to a screen replacing method of a screen printer. The screen replacing method carried out by the conventional screen printer is described with reference to FIGS. 12 and 14. A screen 14 in the printer body 10 is fixed and unfixed by a screen fixing/unfixing section 15. In the automatic screen replacing apparatus 11, a lifter section 16 elevates to position the stocker section 12 in order to house a screen in a desired stocker of the stocker section 12 or to supply a desired screen in the stocker section 12 to the printer body 10. A screen transfer section 17 transfers a screen 14 from the printer body 10 to the automatic screen replacing apparatus 11 or from the automatic screen replacing apparatus 11 to the printer body 10.

FIG. 14 is a flowchart describing a screen replacing method carried out by a printer having an automatic screen replacing apparatus. At #2, the program starts, and at #3, the production of a circuit board starts. If it is determined at #4 that the production of a different circuit board is to be continued, the machine is halted at #21. This operation is performed to allow the operator to specify a screen in the stocker section 12 corresponding to a selected NC program at #23. At #22, the operator selects an NC program that is used for the subsequent production. At #23, the operator specifies the screen in the stocker section 12 corresponding to the selected NC program. At #7, to remove the screen, the machine releases it from the screen fixing/unfixing section 15, and at #8, to house the produced screen, the lifter section of the automatic screen replacing apparatus 11 elevates to position the screen in an empty stocker of the stocker section 12 in which it is to be housed. Then, at #9, the screen is housed in the stocker section. At #10, the lifter section 16 elevates to remove a specified screen from a stocker of the stocker section 12 in which that screen is stored, and is placed at a position at which the desired screen is stored. At #11, the screen is transferred to the printer body 10, and at #12, the screen is fixed. The process then returns to #3 to repeat the same steps. In addition, if it is determined at #4 that production is not to be continued, it is finished at #13.

Next, the data structure of an NC program in a conventional screen printer is described. FIG. 15 shows the data structure of an NC program in a conventional screen printer. #14 is a header section on which the name of the NC program and the date on which the NC program was created are recorded. A program offset section at #15 is a coordinate system on the machine that is information required to relatively replace the coordinates for the NC program. An NC data section at #16 records coordinate values required to align the circuit board with the screen. A mark land data section at #17 records the coordinate values of a circuit board mark and information on a circuit board mark for use, and a screen mark data section at #18 records the coordinate values of a screen mark and information on a screen mark for use. There may be a variation among printed circuit boards. A correction data section at #19 applies recognition correction to the coordinate values of the circuit board mark at #17 and the coordinate values of the screen mark at #18 to accurately position a screen pattern and a circuit board pattern.

When the screen is replaced, the conventional screen replacing method requires the operator to specify one of the stockers of the stocker section in which a desired screen is stored, thereby resulting in an unwanted increase in the number of required steps. In addition, the continuous production of multiple circuit-board types required the machine to be halted each time the circuit-board type is switched, thereby reducing the productivity of the printer.

DISCLOSURE OF THE INVENTION

To solve the first problem, this invention provides a method for controlling a screen printer having an automatic cleaning function, wherein the method has a step, operative concurrently during a screen cleaning operation, of inspecting the result of printing of a circuit board with this operation using a recognition camera so that the result of this inspection can be offset-registered and reflected in the subsequent printing correction operation. This control method can correct the offset between a pattern of a screen and a pattern on the circuit board during the screen cleaning operation. Thus, this invention reduces the number of steps required to inspect the result of printing and the time required to inspect the result of printing to improve the productivity of the screen printer.

In the method for controlling a screen printer according to this invention, to solve the second problem, information on the usage of screens stored in the respective stockers of a stocker section is maintained and the printer determines whether the next screen to be used is unused, so that an automatic solder supply operation can be performed after the replacement of the screen.

This invention eliminates the need for an operator to determine whether cream solder must be supplied and the need to specify the solder supply operation even if solder must be supplied after the replacement of the screen, thereby reducing the number of required steps. This invention also obviates the need to halt the machine to allow the operator to specify the solder supply operation after the replacement of the screen, thereby improving the productivity of the printer.

In the method for controlling a screen printer according to this invention, to solve the third problem, the screen printer having an automatic screen replacing apparatus is characterized by a means for storing therein beforehand an NC program to be used for production, and a means for storing screen information on a screen in a stocker, said screen corresponding to the NC program to be used, so that during automatic screen replacement, the screen stored in the stocker is automatically specified in response to the selected NC program. If a new NC program is selected, the screen is automatically replaced by referencing the data in the screen information storage means.

Thus, during screen replacement, this invention obviates the need for the operator to specify one stocker of the stocker section in which a desired screen is stored, which is needed in the conventional screen replacing method, thereby reducing the number of required steps. In addition, if multiple types of circuit-boards are to be continuously produced, this invention allows stocker numbers to be registered in a screen data section of the NC program during the creation of the NC program. This configuration eliminates the need to perform this operation during the switching of the circuit-board types and thus the need to halt the machine, thereby improving the productivity of the printer.

BRIEF DESCRIPTION OF THE DRAWINGS

FIG. 7 shows the data structure of an NC program for a screen printer according to the embodiment of this invention;

FIG. 15 shows the data structure of an NC program for a conventional screen printer.

BEST MODE FOR CARRYING OUT THE INVENTION

An embodiment of this invention that solves the first problem is described below with reference to FIGS. 1 and 8.

Figure 8:
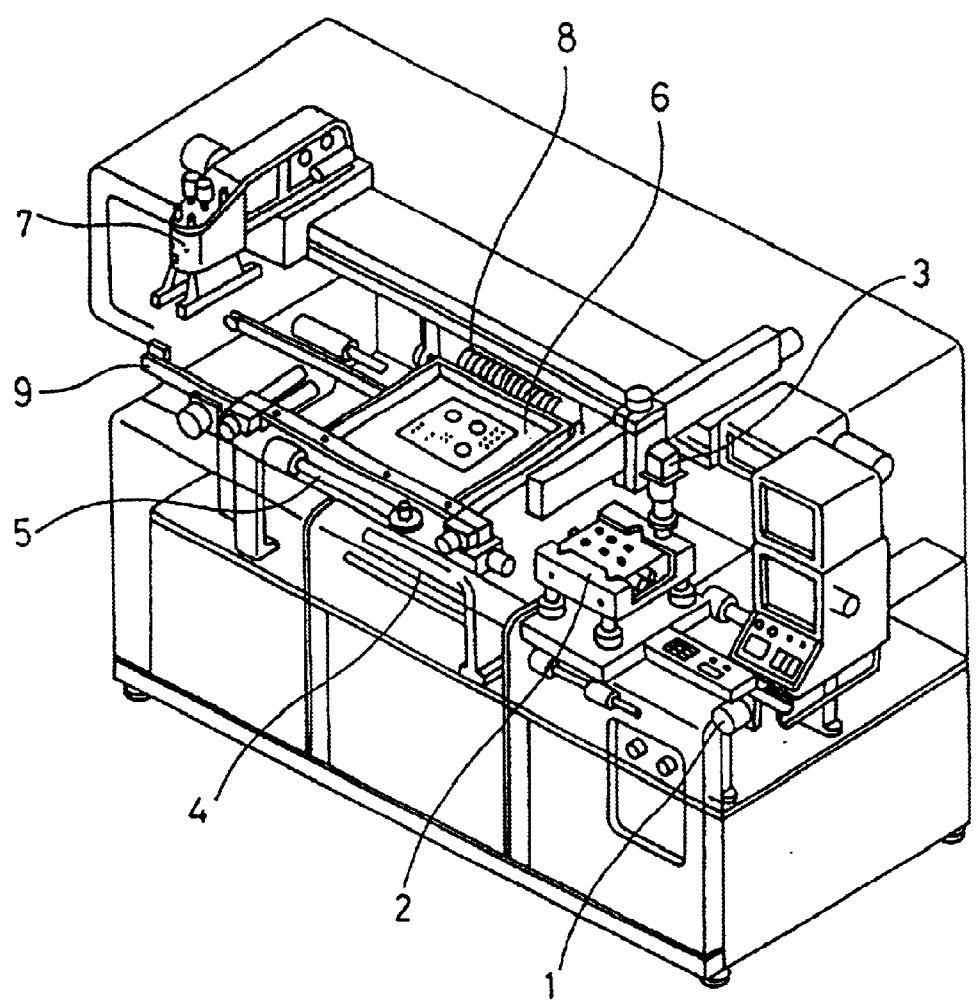
FIG. 8 is a perspective view of a screen printer.

The configuration of a screen printer according to the embodiment of this invention is the same as in FIG. 8.

Figure 1:
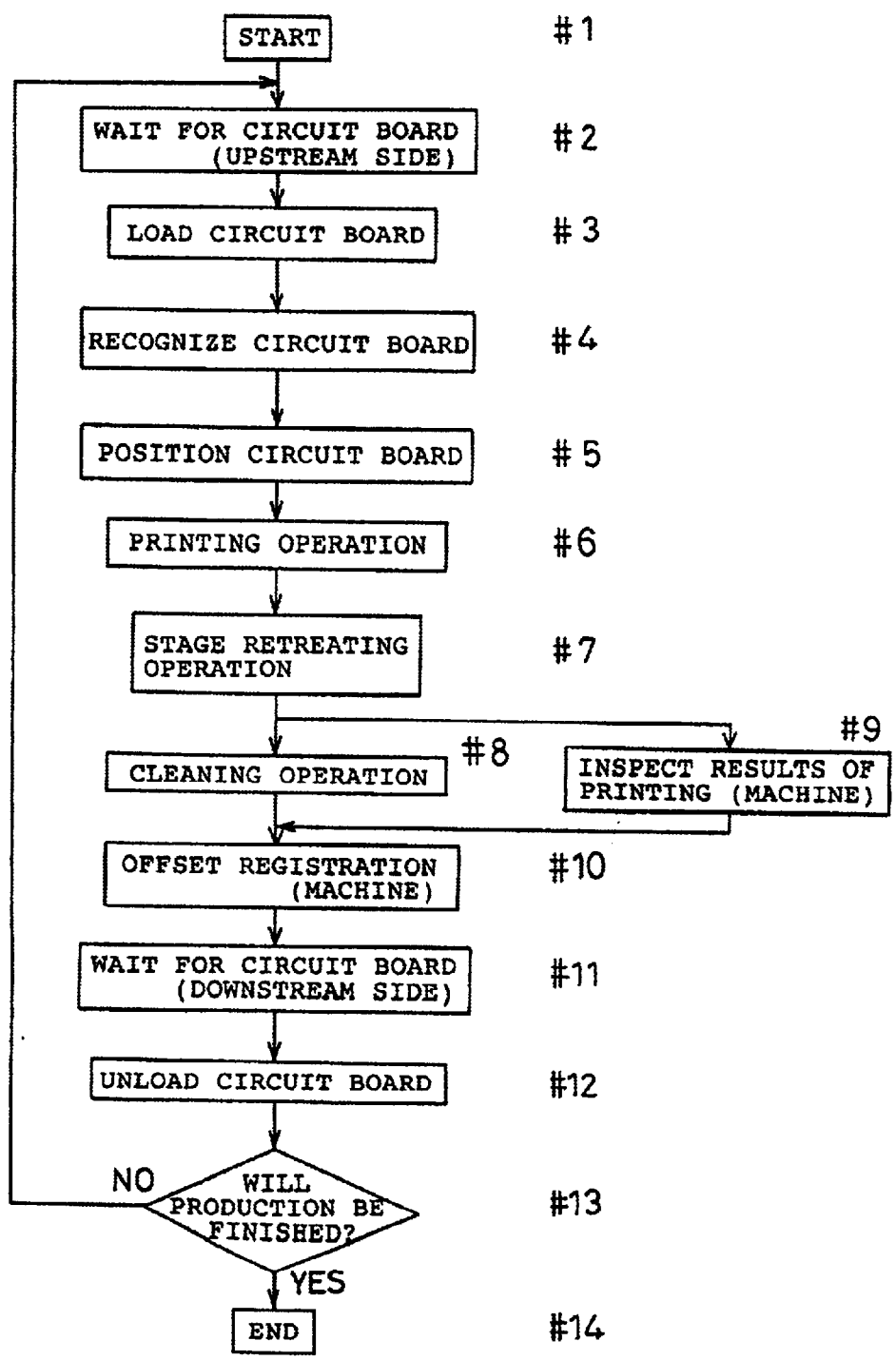
FIG. 1 is a flowchart describing a process executed by a screen printer according to an embodiment of this invention.
Figure 9:
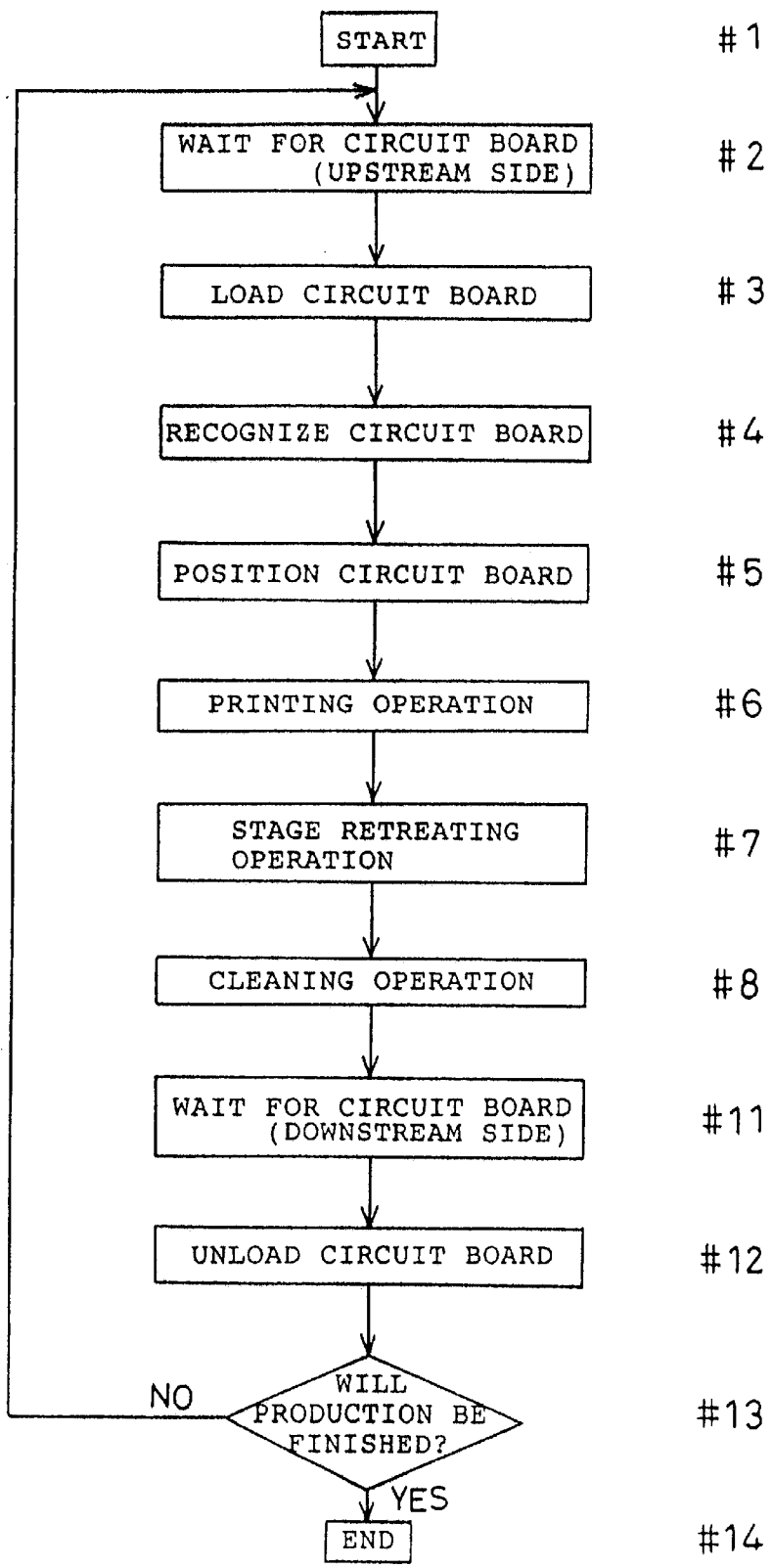
FIG. 9 is a flowchart describing a process executed by the screen printer.
Figure 10:
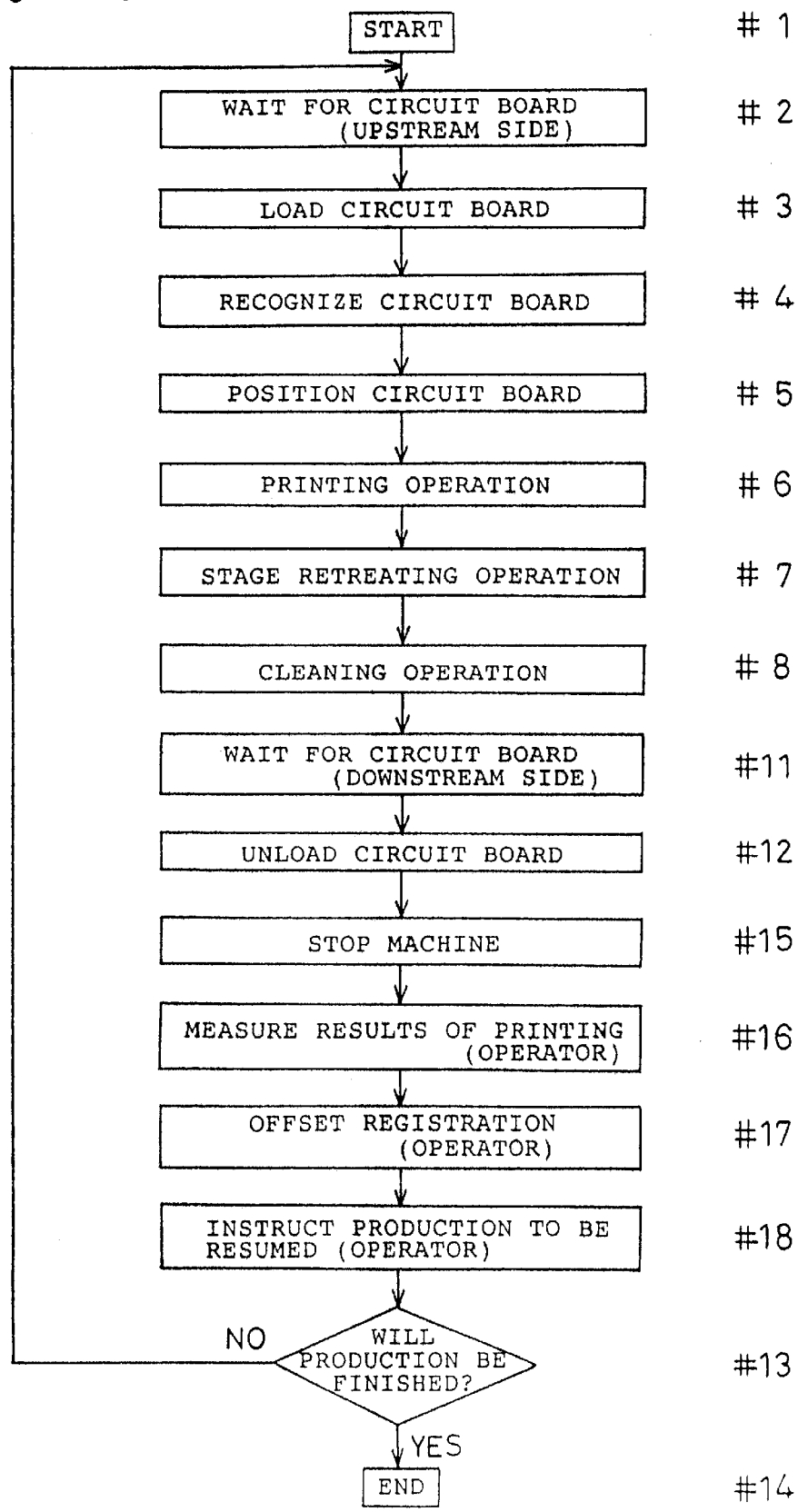
FIG. 10 is a flowchart describing a procedure for improving the printing accuracy of a conventional screen printer having no inspection function.
Figure 11:
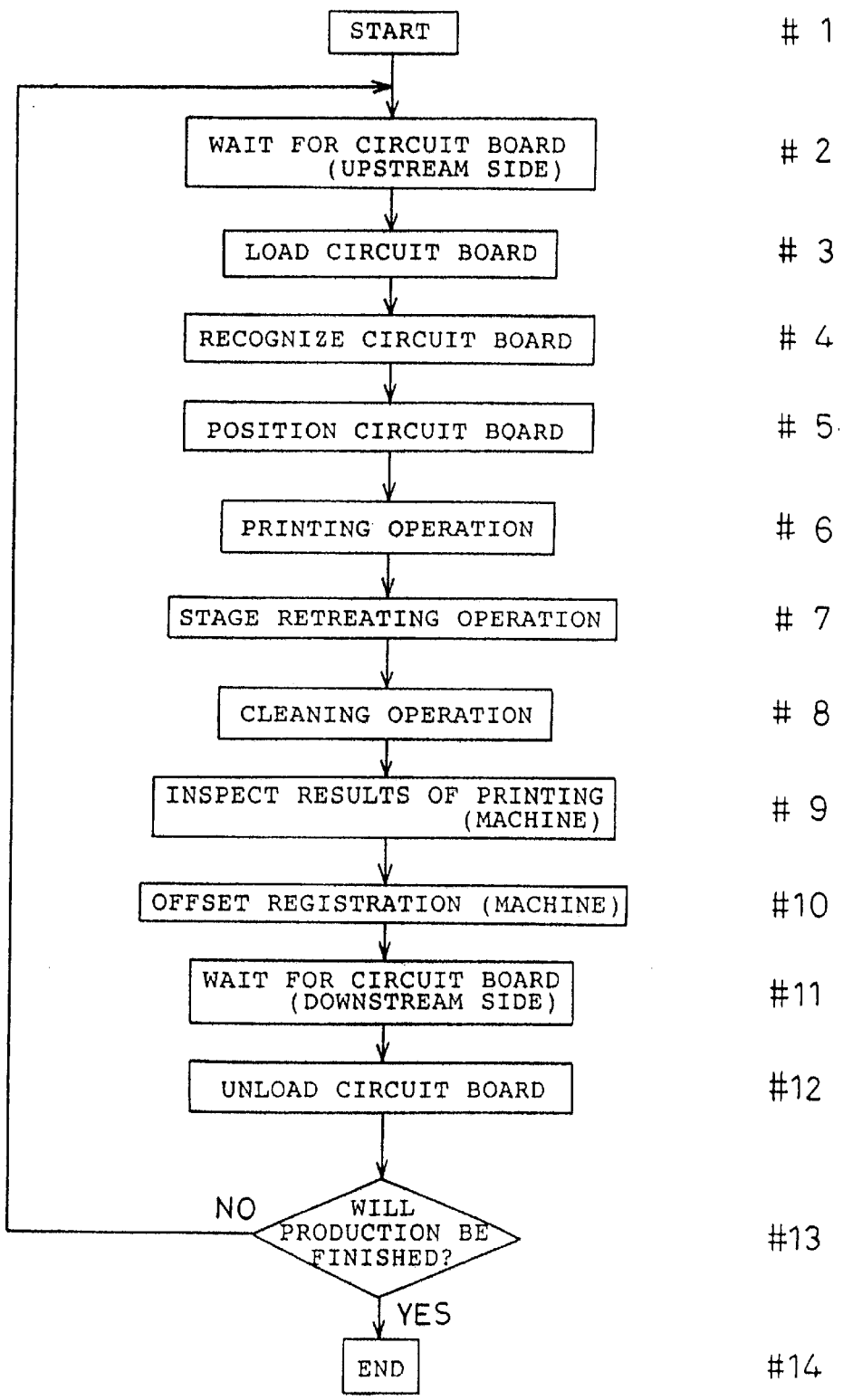
FIG. 11 is a flowchart describing a procedure for improving the printing accuracy of a conventional screen printer having an inspection function.

FIG. 1 is a flowchart describing a process executed by the screen printer according to the embodiment of this invention. Steps #1 to #7 are the same as in FIGS. 9 to 11.

When the program starts at #1 and a circuit board waiting state (upstream side) is exited at #2, a circuit board is loaded by the loader 1 at #3 and fixed to the stage section 2 at #4, and a recognition camera 3 recognizes a circuit board target mark. At #5, a stage moving section 4 and a stage elevating section 5 position the circuit board at a screen target mark that has been already recognized, and at #6, a print head section 7 performs a printing operation. At #7, the stage elevating section 5 retreats the stage section. During the subsequent cleaning operation at #8, a cleaner section 8, which is shown in FIG. 8, moves forward and backward to clean the rear surface of the screen 6, but at this point, the stage moving section 4 on the rear surface of the screen is located so as to contact the cleaner section 8, so the stage moving section must retreat to the loader 1 side together with the circuit board. According to this invention, concurrently with the cleaning operation, at #9, the recognition camera 3 inspects the results of printing for the circuit board that has retreated to the loader 1 side in order to detect the locational difference between a screen pattern and a circuit board pattern. At #10, the machine automatically registers this offset to reflect it in the subsequent circuit board printing correction operation.

When the circuit board waiting state (downstream side) is exited at #11, the stage moving section moves at #12 to unload the circuit board, thereby finishing the production of the one circuit board at #13. Each of these steps is the same as in FIG. 9.

An embodiment of this invention for solving the second problem is described below with reference to FIGS. 2 to 5 and 12.

Figure 12:
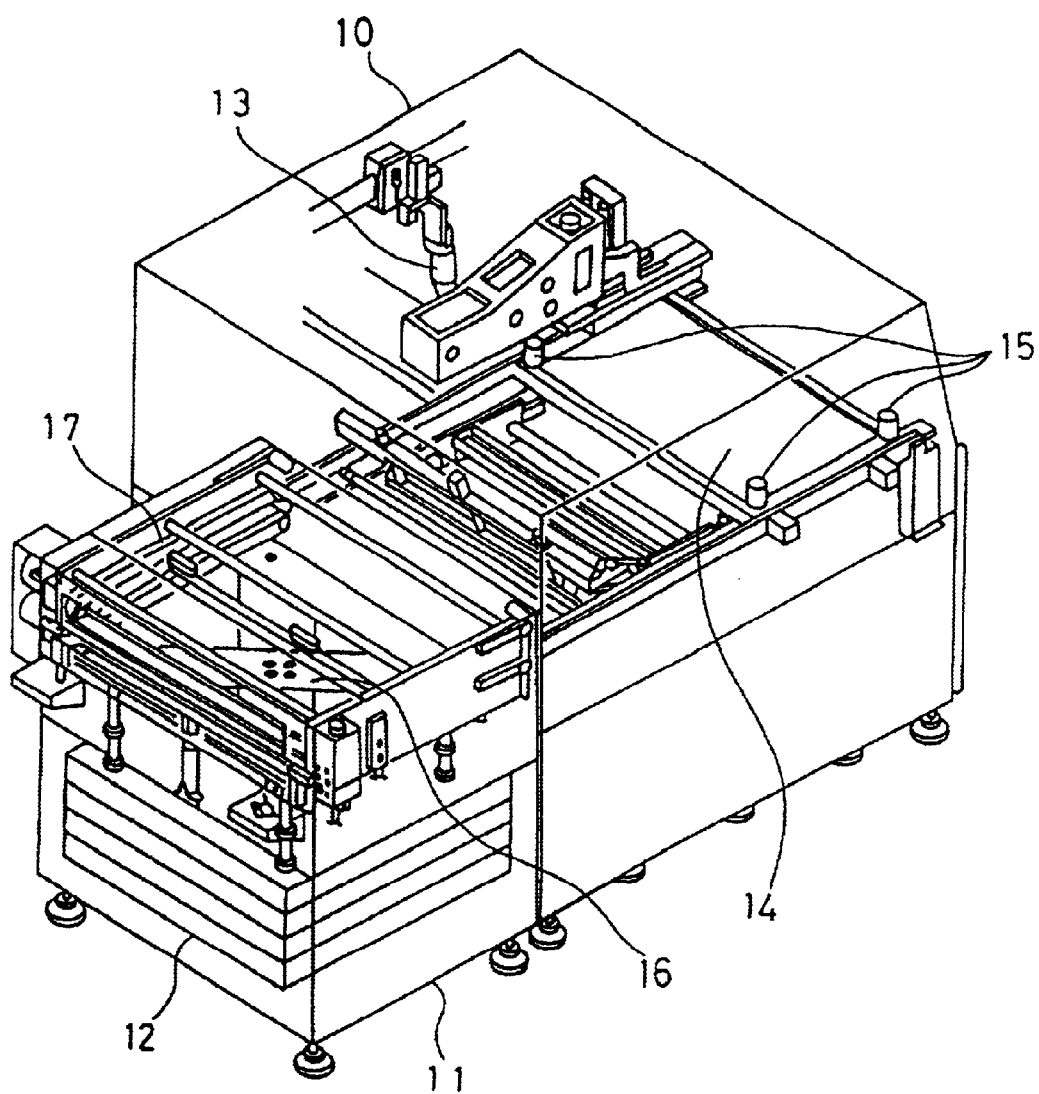
FIG. 12 is a perspective view of a screen printer.
Figure 13:
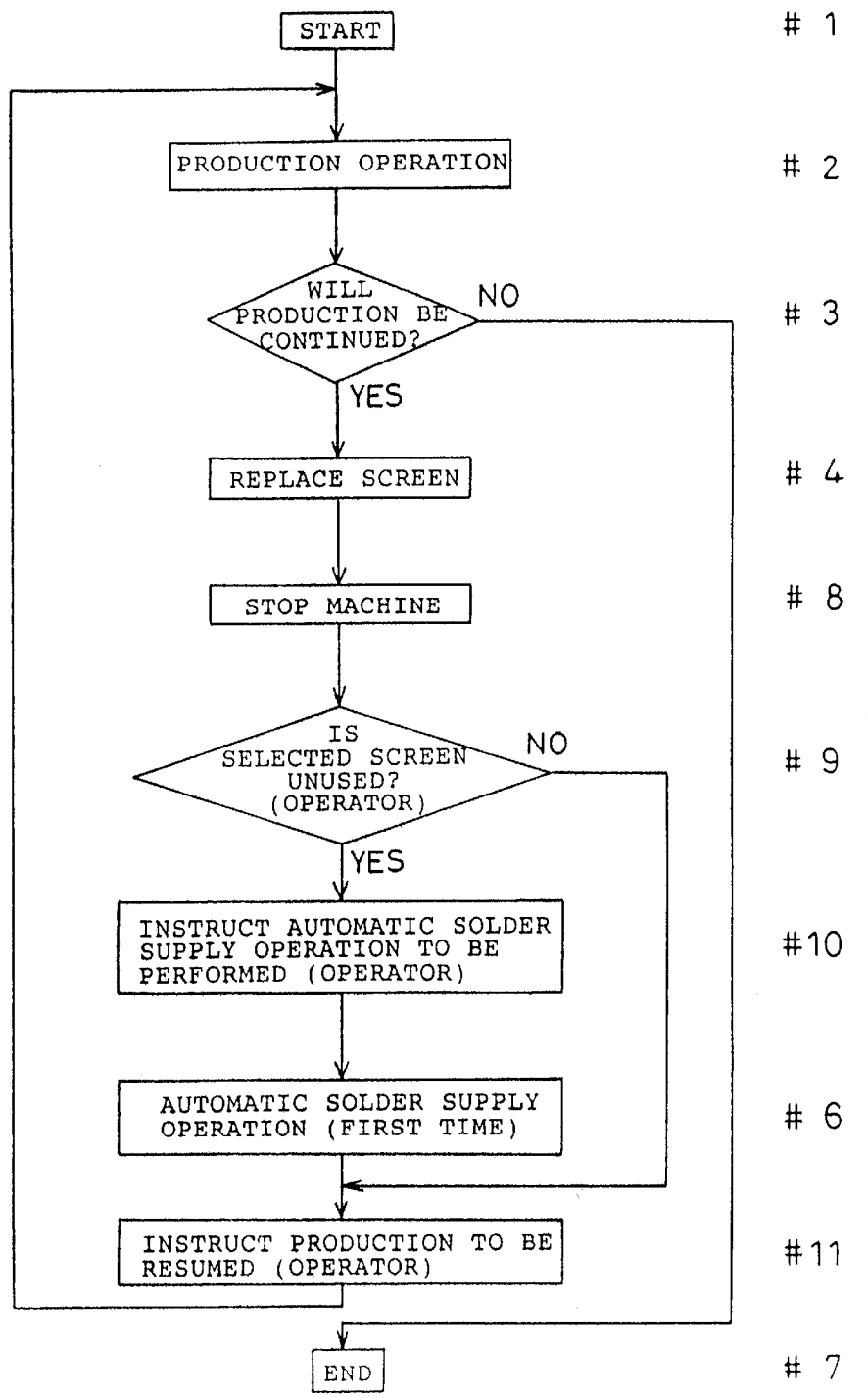
FIG. 13 is a flowchart describing a conventional automatic cream solder supply operation performed after automatic screen replacement.

The configuration used in the embodiment of this invention is the same as in the description of FIG. 12, so its description is omitted.

Figure 2:
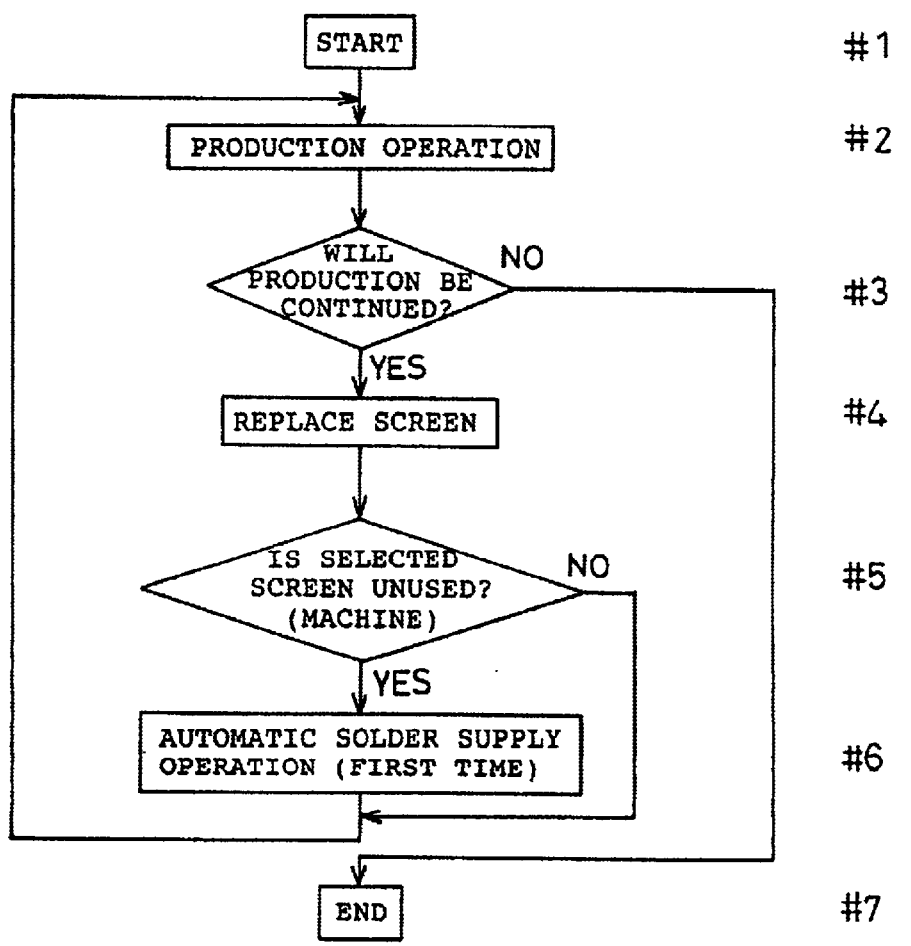
FIG. 2 is a flowchart describing an automatic cream solder supply operation performed after automatic screen replacement according to the embodiment of this invention.
Figure 3:
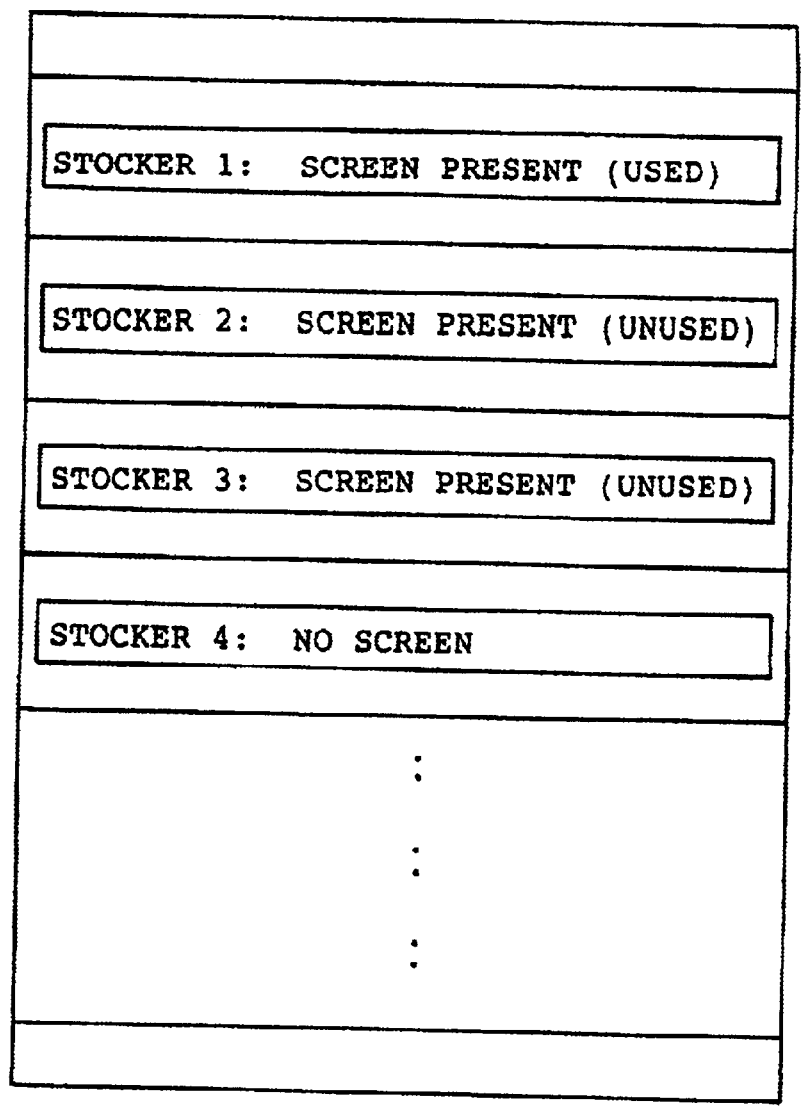
FIG. 3 illustrates information on the usage of screens in a screen replacing apparatus held by a printer according to the embodiment of this invention.

FIG. 2 is a flowchart describing a solder supply method carried out after automatic screen replacement according to the embodiment of this invention. At #1, the program starts, and at #2, the production of a circuit board starts. If it is determined at #3 that the production of a different circuit board is to be continued, the screen is replaced at #4. At #5, a printer body 10 references information on the usage of screens stored in the respective stockers of a stocker section 12 in order to check whether the next screen to use is unused, as shown in FIG. 3. If the screen is unused, an automatic solder supply apparatus 13 automatically supplies solder at #6. If the screen is a used one, the process returns to #2 to resume production of a next circuit-board type without performing the automatic solder supply operation. If it is determined at #3 that production is not to be continued, it is finished at #7.

Figure 4:
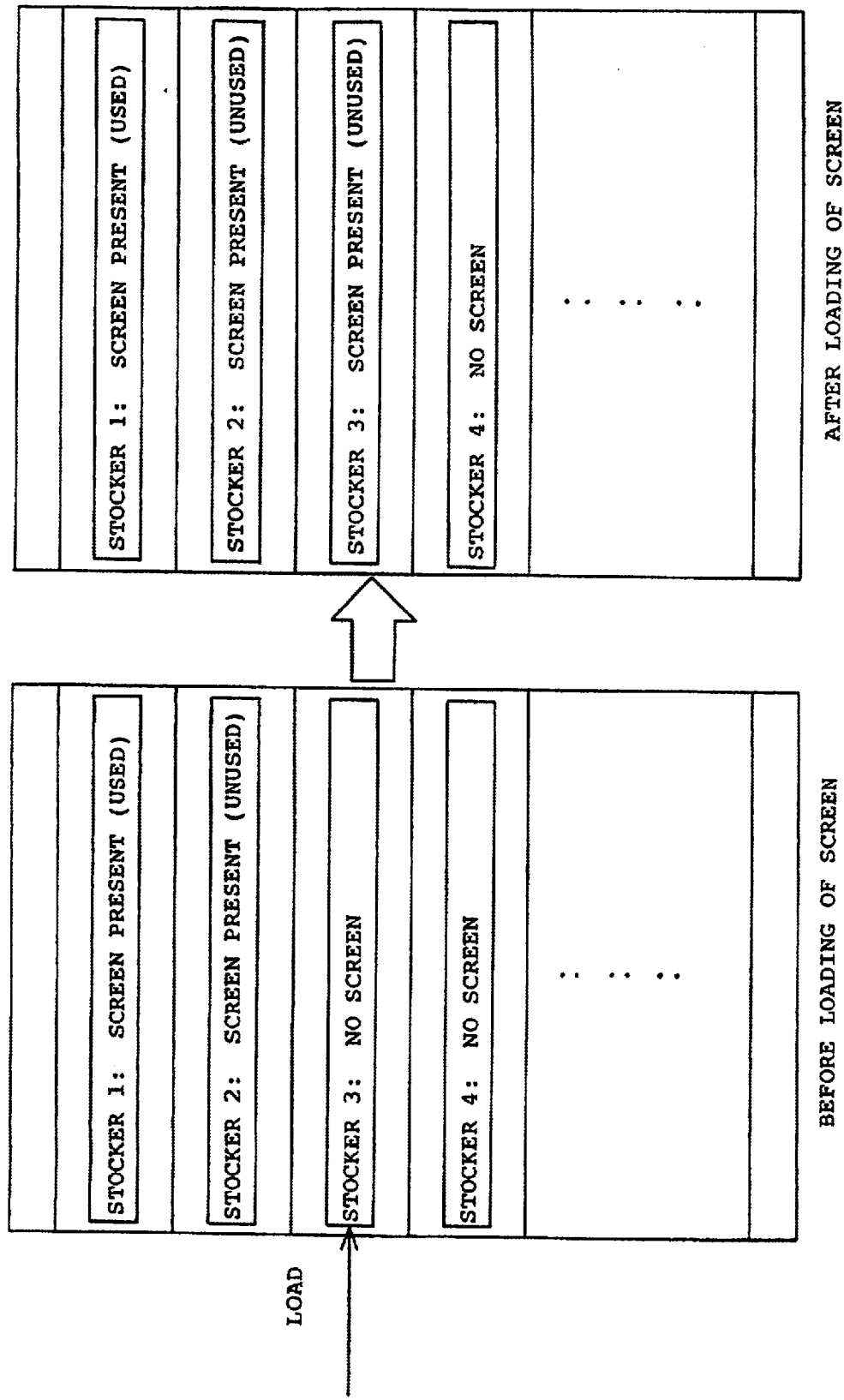
FIG. 4 shows an example of information on the usage of screens in a screen replacing apparatus held by a printer according to the embodiment of this invention.
Figure 5:
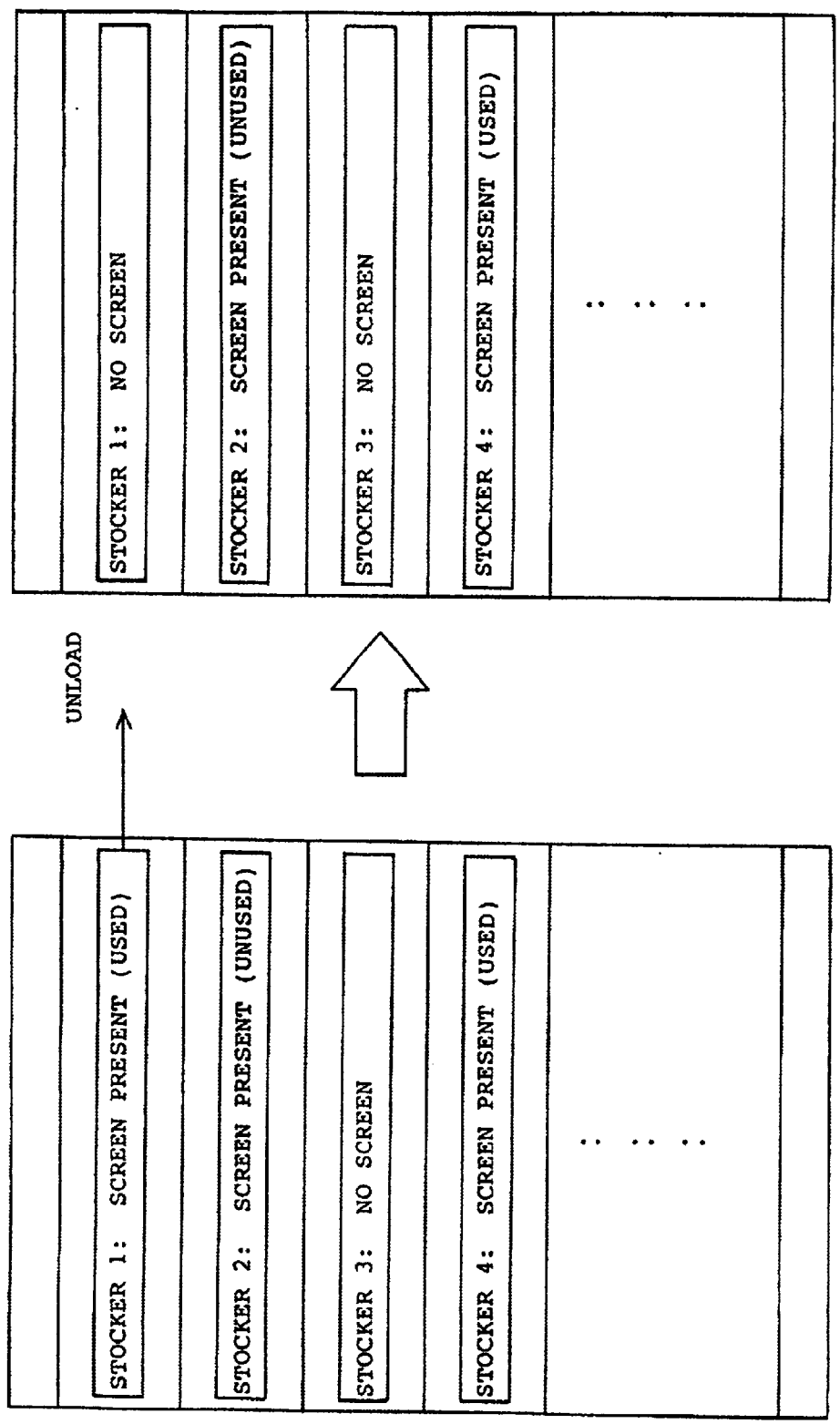
FIG. 5 shows an example of information on the usage of screens in a screen replacing apparatus held by a printer according to the embodiment of this invention.

The information on the usage of the screens is updated, for example, each time an unused screen is fed in the stocker as shown in FIG. 4 or a used screen is unloaded from the stocker as shown in FIG. 5.

Next, an embodiment of this invention that solves the third problem is described below with reference to FIGS. 6, 7, and 12.

The configuration of a screen replacing apparatus according to this invention is the same as in the description of FIG. 12, so its description is omitted.

Figure 6:
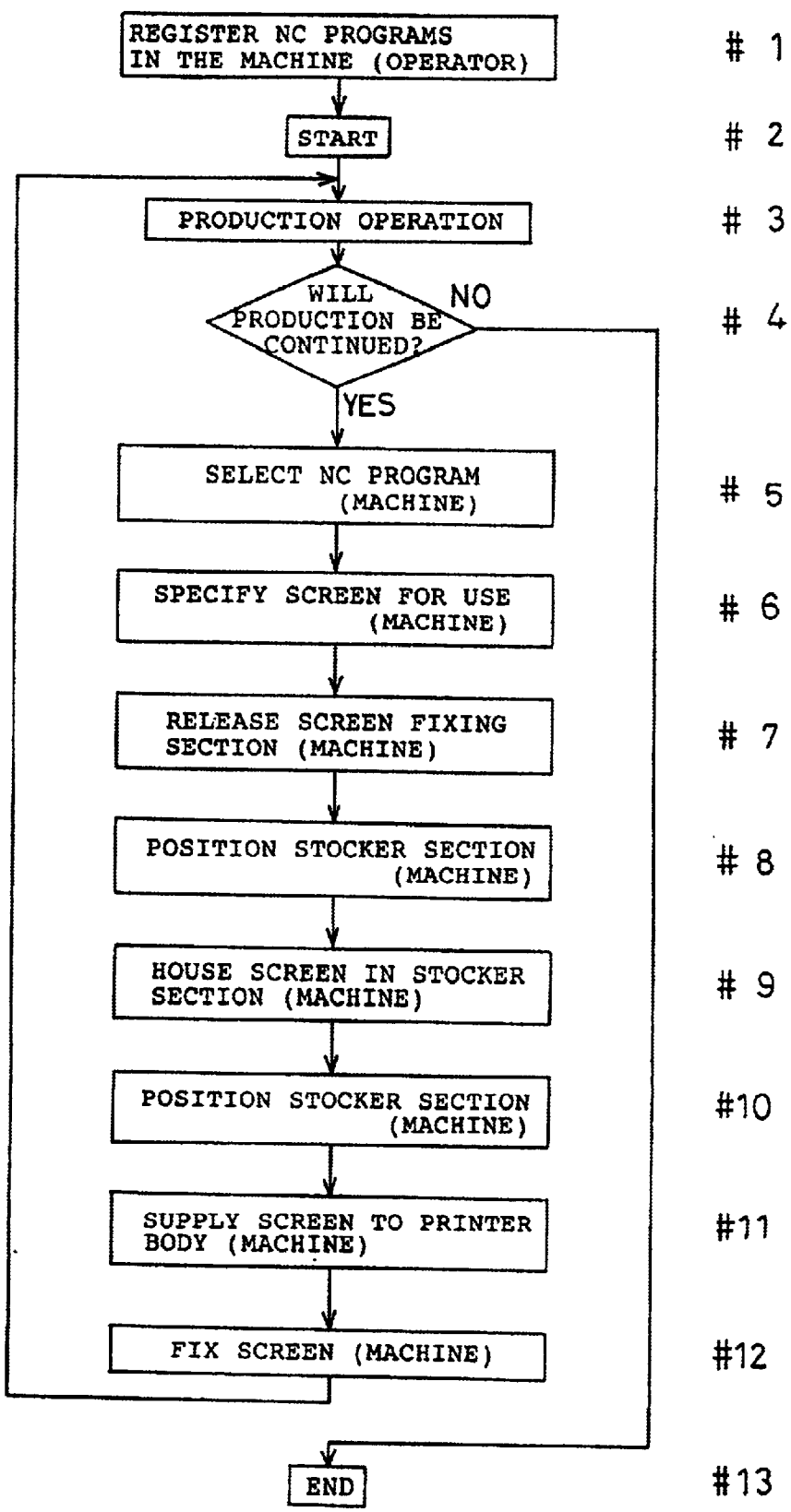
FIG. 6 is a flowchart describing an automatic screen replacing method according to the embodiment of this invention.
Figure 14:
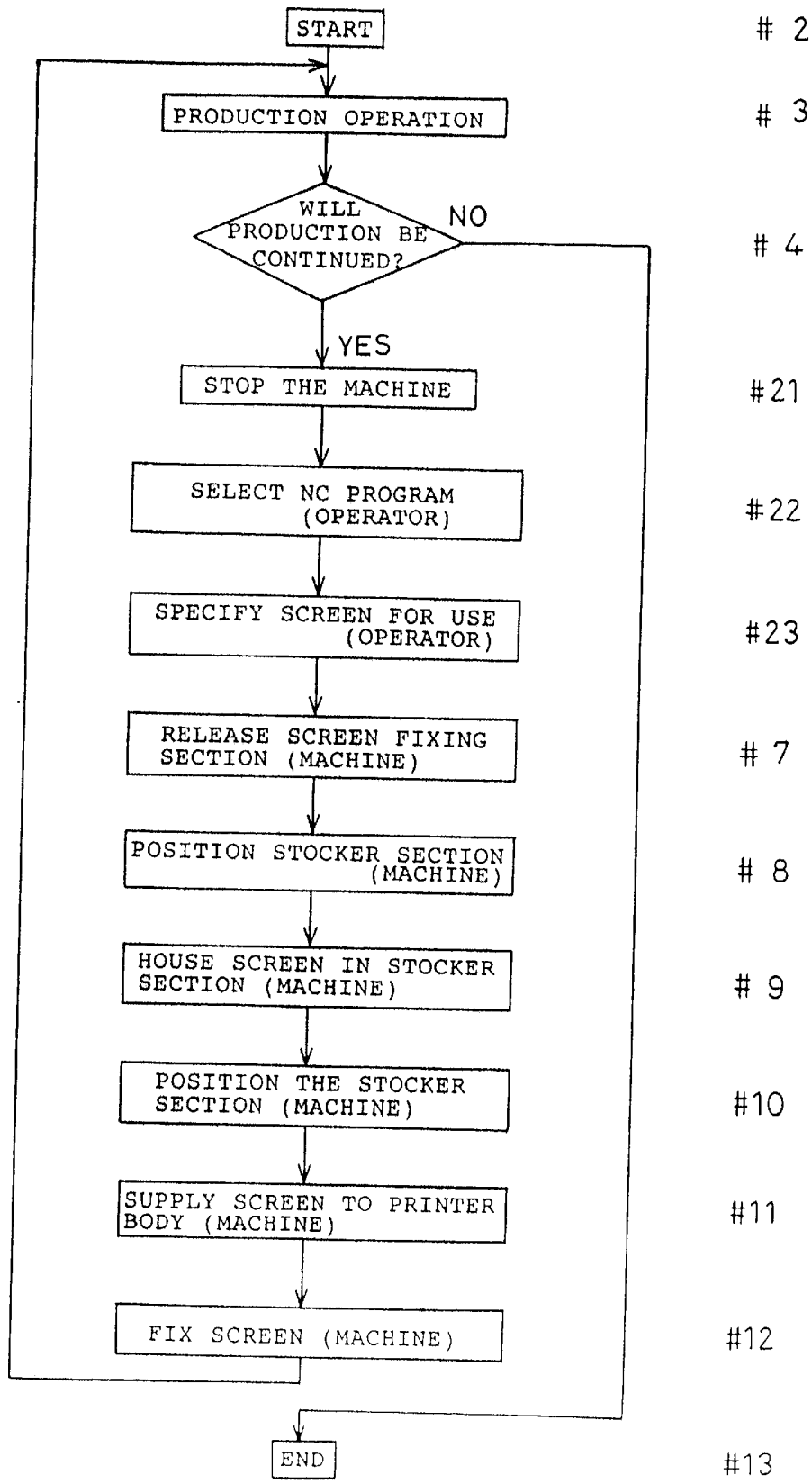
FIG. 14 is a flowchart describing a conventional automatic screen replacing method.

FIG. 6 is a flowchart describing a screen replacing method for a printer having an automatic screen replacing apparatus. First, at #1, to allow multiple circuit-board types to be continuously produced, a plurality of NC programs used for production are registered in the machine beforehand. The program starts at #2, and the production of a circuit board starts at #3. If it is determined at #4 that production is to be continued, then at #5, the machine automatically selects one of the plurality of NC programs registered at #1 that is used for the subsequent production. This step requires the conventional screen replacing method to halt the machine, whereas this invention does not require the machine to be stopped. At #6, the machine references the data structure of the selected NC program to specify a desired screen using one of the stocker numbers recorded on the screen data section. Steps #7 to #13 are the same as in the conventional method in FIG. 14, so their description is omitted.

FIG. 7 is the data structure of an NC program for a screen printer. Items #14 to #19 are the same as in the data structure of the conventional NC program shown in FIG. 15. This invention adds to the data structure of the conventional NC program, item #20 that records screen information such as a stocker number indicting one of the stockers of the automatic screen replacing apparatus in which a screen corresponding to that NC program is stored, and the size of the screen. This configuration enables the screen stored in the stocker of the automatic screen replacing apparatus to be automatically loaded in the printer body in response to the selected NC program.

Data on the screen data section of the NC program must be registered when this program is created.

What is claimed is:

1. A screen printing method for continuously producing a plurality of devices by a screen printer having an automatic screen replacing apparatus, the method comprising:

storing in a printer a plurality of NC programs for use in producing a plurality of devices;

the NC programs including a screen data section for storing therein screen information including at least one of numbers allocated within a stocker storing a plurality of screens and sizes of screens to be used for each NC program, an NC data section for indicating an XY-coordinate position of each screen, and a program offset section for registering therein a result of printing of a circuit board inspected by a recognition camera;

selecting an NC program corresponding to a device to be produced and producing a plurality of devices corresponding to the selected program; and automatically specifying and replacing the screen stored in the stocker, according to the screen information stored in the screen data section and in response to the selected NC program.

2. The screen printing method of claim 1, wherein the screen printer includes a cream solder supply apparatus, the screen information includes information on a state of use of each screen, and the method additionally comprises a cream solder supply operation performed according to that information.

3. A screen printing method for continuously producing a plurality of devices by a screen printer having an automatic screen replacing apparatus and a cream solder supply apparatus, the method comprising:

storing in a printer a plurality of NC programs for use in producing the plurality of devices;

storing in a screen data section, based on the NC programs, screen information including at least one of numbers allocated within a stocker storing a plurality of screens and sizes of screens to be used for each NC program;

selecting an NC program corresponding to a device to be produced and producing a plurality of devices corresponding to the selected program;

automatically specifying and replacing the screen stored in the stocker, according to the screen information stored in the screen data section and in response to the selected NC program; and supplying cream solder according to information on a state of use of each screen.

* * * * *

UNITED STATES PATENT AND TRADEMARK OFFICE
CERTIFICATE OF CORRECTION

PATENT NO.    : 6,748,289 B2
DATED         : June 8, 2004
INVENTOR(S)   : Noburu Nishikawa et al.

It is certified that error appears in the above-identified patent and that said Letters Patent is hereby corrected as shown below:

<u>Title page,</u>
Item [62], Related U.S. Application Data, change "Division of application No. 09/155,817, filed as application No. PCT/JP97/01631 on May 14, 1997, now abandoned" to -- Division of application No. 09/155,817 filed October 6, 1998, now abandoned ,which is a National Stage Application of PCT/JP97/01631, filed May 14, 1997 --.

Signed and Sealed this

Tenth Day of August, 2004

JON W. DUDAS
*Acting Director of the United States Patent and Trademark Office*